United States Patent
Butsch et al.

[19]

[11] Patent Number: 5,838,013

[45] Date of Patent: Nov. 17, 1998

[54] METHOD FOR MONITORING RESIST CHARGING IN A CHARGED PARTICLE SYSTEM

[75] Inventors: Rainer Butsch, Fairport; William A. Enichen, Poughkeepsie; Michael S. Gordon, Somers; John G. Hartley, Fishkill, all of N.Y.

[73] Assignee: International Business Machines Corporation, Armonk, N.Y.

[21] Appl. No.: 746,534

[22] Filed: Nov. 13, 1996

[51] Int. Cl.[6] .................................................. H01J 37/00
[52] U.S. Cl. ..................... 250/492.2; 250/491.1
[58] Field of Search ............................. 250/491.1, 492.2, 250/398, 397

[56] References Cited

U.S. PATENT DOCUMENTS

| | | | |
|---|---|---|---|
| 3,875,415 | 4/1975 | Woodard | 250/491.1 |
| 3,900,736 | 8/1975 | Michail et al. | 250/492.22 |
| 3,900,737 | 8/1975 | Collier et al. . | |
| 3,901,814 | 8/1975 | Davis et al. | 250/491.1 |
| 4,123,661 | 10/1978 | Wolf et al. . | |
| 4,385,238 | 5/1983 | Westerberg et al. . | |
| 4,424,450 | 1/1984 | Ward et al. . | |
| 4,445,039 | 4/1984 | Yew . | |
| 4,791,302 | 12/1988 | Nozue | 250/491.1 |
| 4,992,661 | 2/1991 | Tamura et al. . | |
| 5,043,586 | 8/1991 | Giuffre et al. | 250/491.1 |
| 5,424,548 | 6/1995 | Puisto | 250/491.1 |

OTHER PUBLICATIONS

R.F. Pease, Resist Charging in Electron Beam Lithography, May, 1995.

K.D. Cummings, A Study of Deposited Charge From Electron Beam Lithography, J. Vac. Sci. Technol. B. 8(6), Nov./Dec., 1990.

Paul F. Petric, Michael S. Gordon, Joseph J. Senesi and Donald F. Haire, EL–4 Column and Control, J. Vac. Sci. Technol. B. 11(6) Nov./Dec. 1993.

*Primary Examiner*—Bruce Anderson
*Attorney, Agent, or Firm*—Schmeiser, Olsen & Watts; Steven Capella

[57] ABSTRACT

A method for monitoring resist charging in an electron beam lithography system is disclosed. The method involves the use of a reference plate (REFP) registration scheme in which a resist-coated REFP having registration marks on a substrate is prepared and scanned. The scanning process includes the deposition of an amount of charge on the surface. Then the REFP is coated with a resist to be tested and scanned again. The difference between the two scans is calculated. Preferably, each scan is performed first with the stage moving in a forward-ordered serpentine path in the tool to determine the perceived positions of the registration marks and then in a backward-ordered serpentine path. As the tool's stage moves from field to field, a small charge is deposited on the REFP to simulate the effect of a writing process. The difference between the forward and reverse scan position measurements is then determined. As any intrinsic positional errors in measurement will cancel out, the forward/backward error provides a monitor of the magnitude of resist charging.

26 Claims, 5 Drawing Sheets

Fig. 1

FORWARD PATH

Fig. 2

REVERSE PATH

METHOD FOR MONITORING RESIST CHARGING IN A CHARGED PARTICLE SYSTEM

TECHNICAL FIELD

This invention relates generally to the manufacture of semiconductor devices, and more specifically to a method for monitoring resist charging in a charged particle system.

BACKGROUND OF THE INVENTION

Manufacturing of semiconductor devices is dependent upon the accurate replication of computer aided design (CAD) generated patterns onto the surface of a device substrate. The replication process is typically performed using lithographic processes followed by a variety of subtractive (etch) and additive (deposition) processes. The CAD patterns are transferred to the surface of the device substrate by a number of different processes, including photolithography, ion beam lithography, and e-beam lithography. In the case of a charged particle system, a precise beam of the charged particle is directed to a specific point on the surface of a material that is sensitive to relatively small amounts of energy to selectively initiate a response by the material at that point.

An example of a charged particle system includes an electron beam ("e-beam") system. The e-beam lithography process generally comprises the steps of: programming a desired image pattern into an e-beam exposure tool; mounting a resist-coated substrate, generally a silicon wafer, into the tool, where it is then internally transferred into the tool's stage chamber and clamped onto a writing stage; and writing the programed pattern onto the substrate with a beam of electrons. The most significant challenges in e-beam lithography processes are size control and placement accuracy of specific image patterns. As the critical dimensions within IC's continue to decrease, these factors become even more significant and challenging.

It is well-known that resists are generally non-conductive. However, as the electrons in e-beam or other charged particles penetrate the reactive film, the charged particles undergo an energy loss scattering process, which brings them to rest. The electric fields generated by these trapped electrons deflect the charged particle beam as the beam is exposing the adjacent site. This may occur with any resist, either positive or negative. The charged particles may become trapped in the resist, and can remain there for many hours after exposure. This charging of the resist is a well-recognized source of undesirable pattern or image placement errors, as the trapped charge causes the e-beam to be deflected from the path of the programmed pattern, resulting in widened or misplaced images. For example, charging-induced errors of over 0.5 micorometers have been observed on a grounded silicon substrate. With the demands put on e-beam systems by the continually decreasing size of IC devices, such placement errors can be detrimental to the system.

To the extent that placement errors are repeatable, for instance from features intrinsic to the resist or from features intrinsic to the process, such as problems with respect to mirror orthogonality, magnification effects from temperature differences between the write tool and the metrology tool, the charge depositing history, i.e., any time a charge is deposited it will have an impact on the adjacent cells, and resist heating errors, they can be calibrated out and a number of calibration and correction schemes have previously been developed. Certain error correction schemes can be automated within the tool and can provide frequent recalibration and tool diagnostics, while other schemes are determined off-line and are stored in the tool's controller, and are subject to less frequent updates. Beyond these repeatable errors, random placement errors, such as thickness variation or the presence of contaminants in the formulation, which increase the amount of noise, also occur. Resist charging has been recognized as a significant contributor to random errors in image pattern placement, and it therefore has become critical to provide a method for effectively and efficiently monitoring resist charging in an e-beam lithography process. Furthermore, it is desirable to provide a method for reducing the magnitude of resist charging during an e-beam process. It is desirable to provide a method which would result in an elimination of the effects of resist charging.

One existing method for monitoring resist charging is described in K. D. Cummings, *A Study of Deposited Charge From Electron Beam Lithography*, J. Vac. Sci. Technol. B 8(6), 1786–1788 (1990). In this method, three separate patterns are direct-written onto a workpiece with an e-beam tool. The workpiece is then removed from the e-beam tool and the distances between the various patterns are measured and evaluated over a period of hours to determine charging-induced errors. A major disadvantage of this method is its time-consuming and costly nature, because the workpiece must be patterned and then removed from the exposure tool and evaluated over an extended period of time.

An alternate method is described in R. F. Pease, *Resist Charging in Electron Beam Lithography*, SRC Technical Report T95068, May 1995. This method involves irradiating the workpiece with an electron flood beam and then evaluating the resulting charging by the deflection of an electron beam in a scanning electron microscope (SEM). A significant drawback of this method is that it does not provide an evaluation of the effects of localized charging, but instead, evaluates the effects of the global charging of the entire workpiece. Furthermore, this method requires the use of additional costly equipment and hardware.

Therefore, there exists a need to develop a cost effective and time saving method for monitoring resist charging in an e-beam lithography system. The method should provide an in situ evaluation of resist charging, rather than require the use of additional processing or machinery. Furthermore, there is a need to develop a method for controlling the magnitude of resist charging that results during an e-beam lithography process, both to reduce the amount of charging and to control the amount of charging.

SUMMARY OF THE INVENTION

The present invention relies on a reference plate (REFP) registration scheme wherein registration marks are patterned and exposed onto a substrate. The REFP is then coated with the resist to be tested and placed in the tool in which the resist is to be tested, e.g., the tool in which the writing process would normally occur on the manufacturing line. The marks are then used to monitor the effects of resist charging during the writing or lithographic process.

The steps of the preferred embodiment of the method of the present invention involve: patterning registration marks onto a workpiece substrate; processing the workpiece to yield gold-plated marks, thereby forming the reference plate, or "REFP"; placing the REFP onto an X-Y stage of an e-beam exposure tool; determining the X-Y grid positions of the registration marks by scanning the tool's e-beam over the workpiece with the X-Y stage moving in a first direction, typically a forward-ordered serpentine path (forward scan);

determining the X-Y grid positions of the registration marks by scanning the e-beam over the workpiece with the X-Y stage moving in a second direction, typically a reverse-ordered serpentine path (reverse scan); and calculating the differences in the perceived positions of the registration marks, as determined by the first and second scans. These scans provide a reference and the REFP is then coated with a resist and the first and second scans are then repeated. The differences in the perceived positions of the marks following these scans are the result of resist charging.

The method thus provides a time-saving and cost-effective in situ method to monitor the localized effects of resist charging. The method overcomes the disadvantages of previous methods, as it does not require additional patterning, exposures or equipment hardware and provides results within minutes rather than hours. The method of the present invention may also be a powerful tool in minimizing the placement errors that occur because of resist charging by allowing more precise selection of resist material. Numerous other advantages and features of the present invention will become readily apparent from the following detailed description of the preferred embodiment, the accompanying drawings and the appended claims.

DETAILED DESCRIPTION OF THE PREFERRED EMBODIMENT

Although this invention is susceptible to embodiment in many different forms, preferred embodiments of the invention are shown. It should be understood, however, that the present disclosure is to be considered as a exemplification of the principles of this invention and is not intended to limit the invention to the embodiments illustrated.

Briefly, the present invention comprises the steps of: providing a substrate having bare registration marks in a number of fields; providing an charged particle beam lithography tool including an X-Y stage and a final lens having a center tube; performing a first charged particle beam scan of a first field of a number of fields to determine a perceived position of the bare registration marks; depositing an electron charge at predetermined positions within the number of fields on the substrate; moving the X-Y stage of the charged particle beam lithography tool from the first field to a second field; repeating the charged particle beam scanning step, the deposition of charge step, and the movement step until the number of fields of the bare registration marks have each been scanned; performing a second charged particle beam scan of the bare registration marks by repeating the charged particle beam scanning step and the deposition of charge step, and the movement step until the number of fields have each been scanned, the movement step being carried out by moving the X-Y stage of the charged particle beam lithography tool in a direction different from the first movement to determine the position of the bare registration marks; determining the difference in the position of the bare registration marks as determined by the first and the second charged particle beam scans; depositing a layer of a resist onto the substrate, thereby forming resist-coated registration marks; repeating the first and second scans of the number of fields and determining the difference in the position of the resist-coated registration marks as determined by the first and second charged particle beam scans; and determining the difference in the position of the bare registration marks and the resist-coated registration marks.

A preferred embodiment of the present invention relies on a reference plate registration scheme. In this procedure, the workpiece is a substrate, which is typically an X-ray mask, a silicon wafer, or a piece of glass with chrome markings. The substrate, when patterned with an array of registration marks using standard lithographic techniques is referred to as the reference plate or "REFP". The registration marks may be in any location on the REFP, as long as their locations are known. However, there is usually a pattern that is convenient to use with a particular implementation. In general, the grid pattern selected is tied to the hardware implementation of a registration scheme of a particular lithography system. For example, different step and repeat e-beam tools may differ in their field size, so the grid periodicity would need to be varied to match the field size.

The substrate is chosen and a layer of a resist material is applied, exposed and then developed. A high contrast material such as gold is plated in the registration marks, i.e., the regions where the resist was removed by developing. The gold-plated registration marks provide a high-contrast signal when an electron beam is scanned over them and is, therefore, a preferable material. However, all that is needed is that the registration signal contrast sufficiently with the signal in non-registration areas.

The first requirement in most cases is that the atomic number of the material used to form the features be significantly different from the atomic number of the background material because the scattering of electrons is proportional to the atomic number to the second power. The larger the difference, the better the registration signal contrast. It is desirable that the material be conductive so as not to introduce additional charging and that it is unreactive so that oxides do not form because they could charge. Tungsten and tantalum are two other materials that would be suitable.

Surface topology is another contrasting feature that may be exploited to form the registration marks. For example, marks may be layered on the surface of the substrate and then an etch may be performed on the substrate in order to produce raised marks. The marks can also be formed from voids in the material, as is the case with stencil masks, in which holes are the features whose locations are to be determined. There is adequate contrast between areas of silicon and areas without silicon to determine the location of the voids or holes. Another instance where voids may be used as the locators is with respect to chrome/glass masks. In this case the resist is used to form a pattern and the chrome is etched away in the areas that are open, thus forming the contrast between chrome and no-chrome areas.

A layer of the particular resist which is to be evaluated is then deposited onto the REFP, over the registration marks. The resist may be any one of a number of materials that will selectively react when exposed to an actinic energy source. If desired, a layer of a water soluble, conductive polymer derivative or "top coat" could be coated on the surface of the resist. This would be desirable if the resist were so likely to charge that it would always be desirable to reduce this effect by coating it with a material that would reduce the errors in writing.

Figure 1:
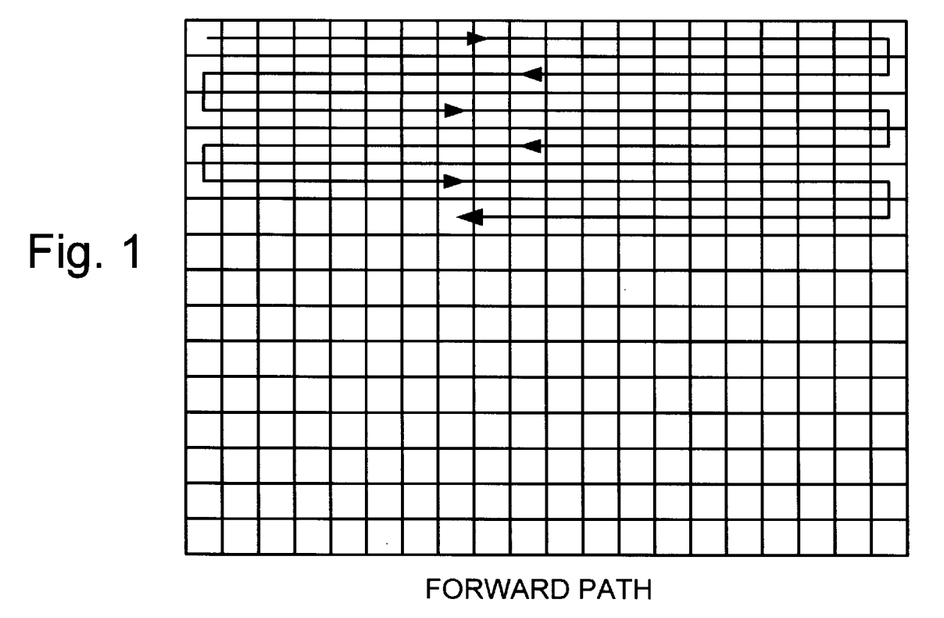
FIG. 1 is a schematic illustrating a forward-ordered serpentine path of an X-Y stage motion of an electron beam tool of a preferred embodiment of the present invention.

The resist-coated REFP is then mounted into a charged particle exposure tool, for example, an electron beam (e-beam) exposure tool, where it is internally transferred to the stage of the tool. The tool must have the ability to register where it is relative to the workpiece. The stage is then moved from field to field in a first path, preferably a forward-ordered serpentine path, (forward scan) beginning in the upper left field of the X-Y grid. In each field, the e-beam is scanned through the entire field surface or the selected areas of the field. Then the X-Y stage is stepped through each grid field until the entire REFP has been scanned. FIG. 1 illustrates the ideal forward scan grid path as specified by the e-beam tool commands. The actual grid on the REFP will, however, have small but detectible physical errors caused by workpiece fabrication imperfections, such as resist thickness variations, for example. Because of these physical errors, the tool perceives the grid field location to be deflected from the ideal command location.

As the e-beam arrives at each field on the grid, it electrostatically scans the mark to measure the distance between the ideal grid location and the perceived grid location of the registration marks. Before moving to the next field, the tool deposits a measured amount of charge onto the REFP, either by exposing a real or a dummy pattern. If a real pattern were exposed, this would simulate the charge deposited onto the resist during normal writing, thereby mimicking the effect of deposited charge in one field on another in the pattern that is being tested. The errors associated with that field are then stored, the stage is moved to the next field position, and the process repeated.

Figure 2:
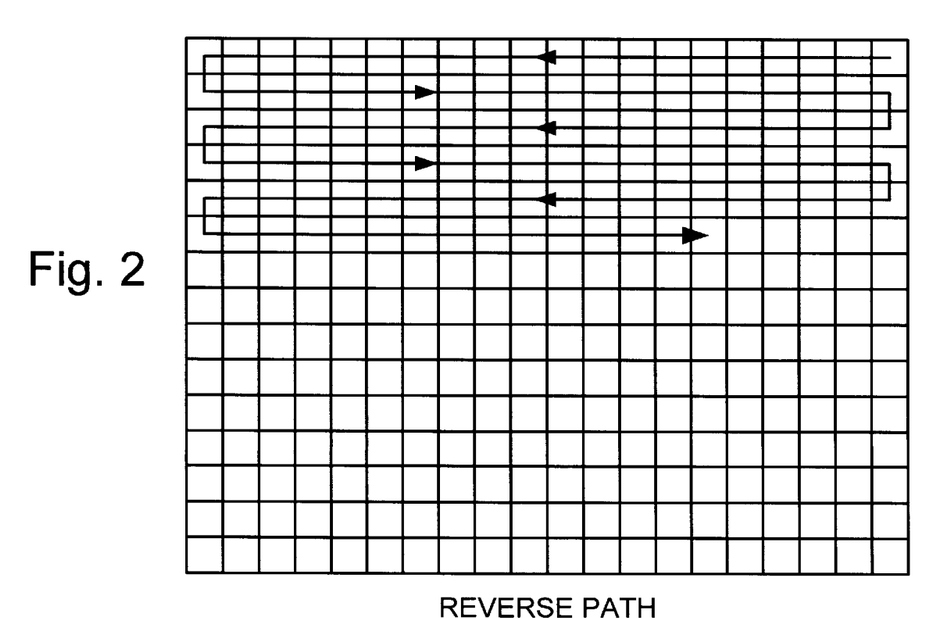
FIG. 2 illustrates a backward-ordered serpentine path of an X-Y stage motion of an electron beam of a preferred embodiment of the present invention.

After the completion of the first scan, the REFP is subjected to a second scan, but in this step, the charged particle writing system follows a different path in order to increase sensitivity. Preferably, the stage would move in a reverse ordered serpentine path (reverse scan), as illustrated in FIG. 2. The perceived field locations of the registration marks are again determined and recorded.

Figure 3:
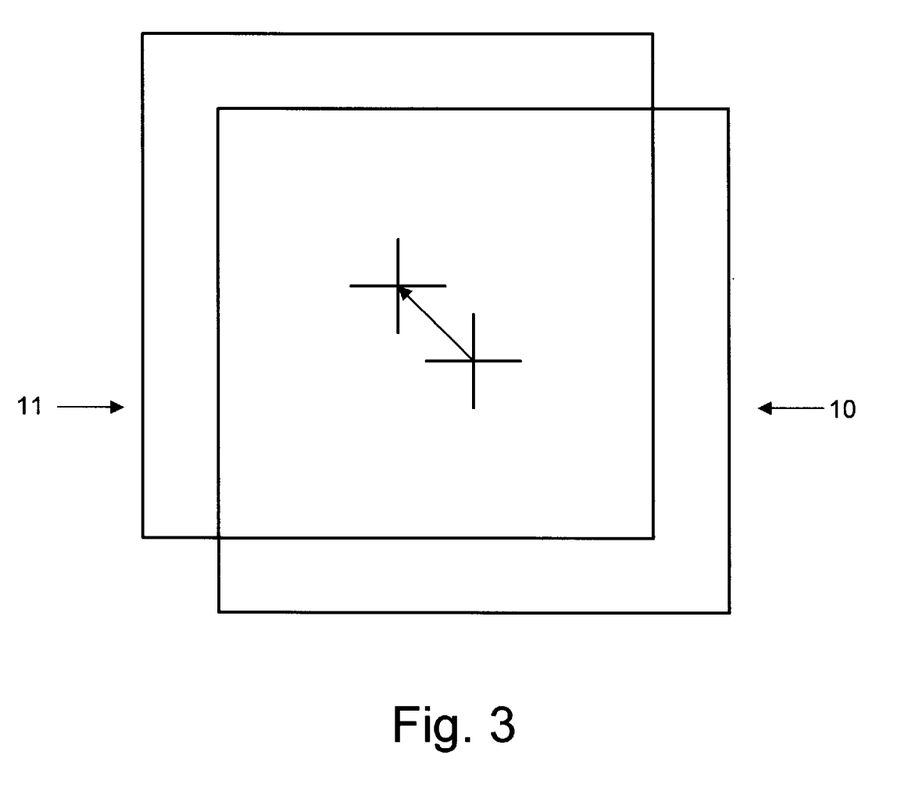
FIG. 3 illustrates the difference between the ideal grid location of a reference plate registration mark as specified by an e-beam tool's commands, and the grid location as perceived by an e-beam scan of the reference plate.

Under ideal conditions, the perceived field locations would be the same in the bare plate, forward and reverse scans. However, due to the effects of the deposited charge, the charged particle is deflected a different amount from the ideal grid during the reverse scan. This error is path dependent. The error has reverse signs in the forward scan as compared to the backward scan, thereby increasing the sensitivity when the two are subtracted. This effect is illustrated in the schematic of FIG. 3, where reference numeral 10 indicates the field location as specified by the e-beam tool commands, and reference numeral 11 indicates the field location as perceived by the e-beam tool in either the forward scan only or the reverse scan only.

Figure 6:
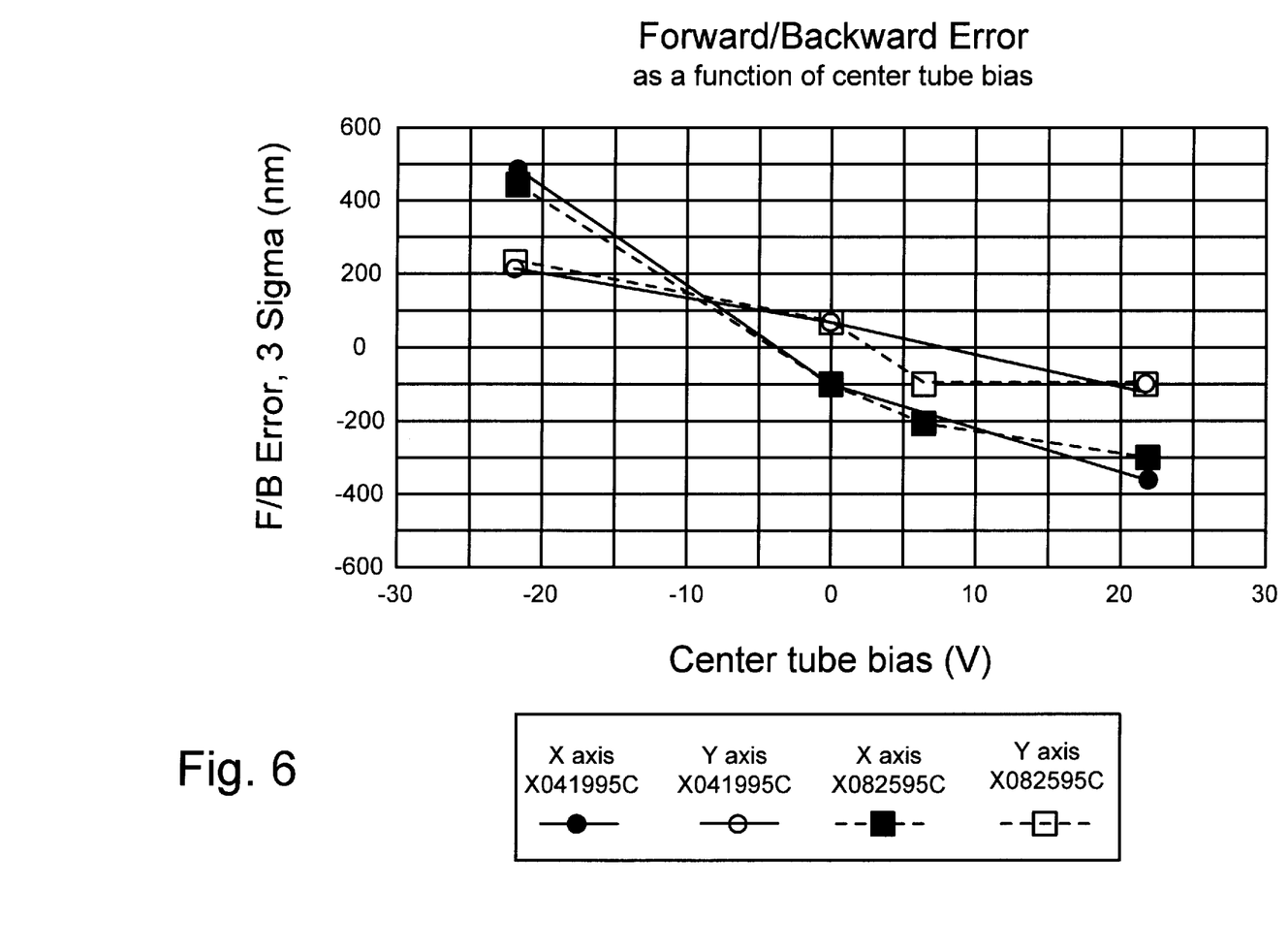
FIG. 6 is a graphic representation of the forward/backward error as a function of center tube bias.
Figure 7:
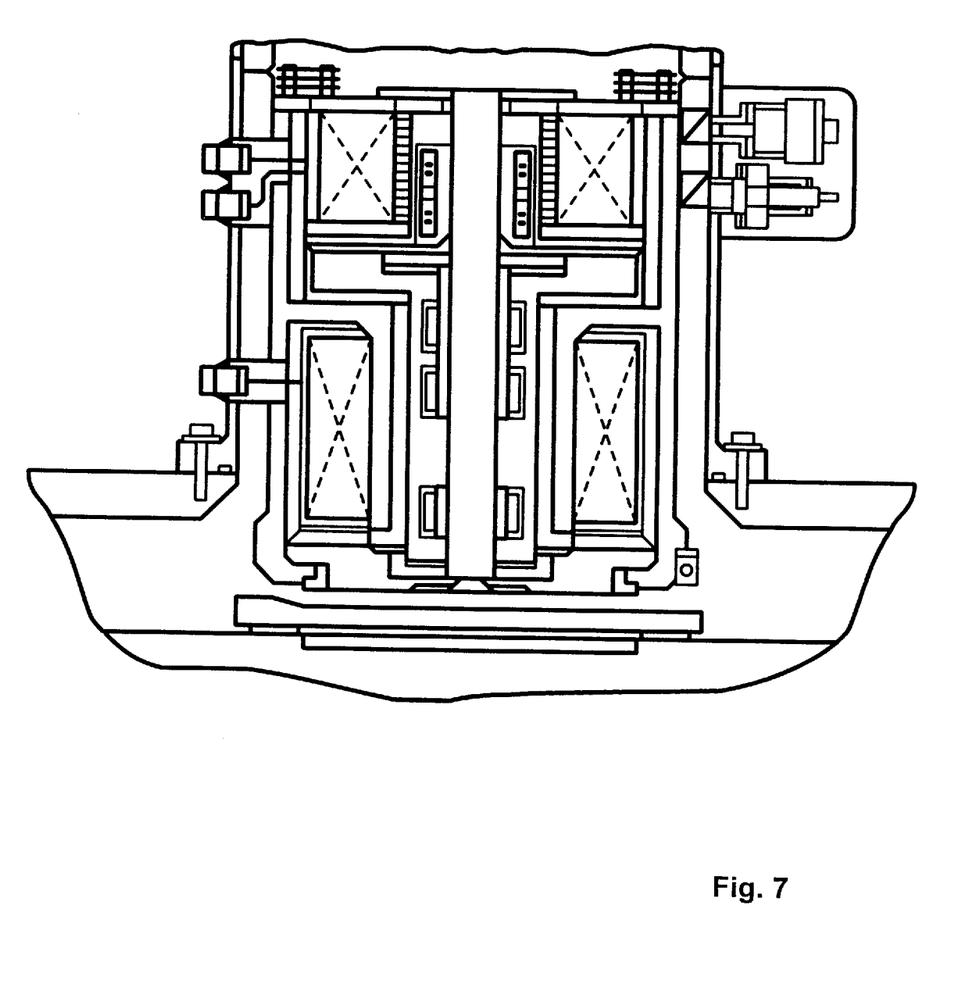
FIG. 7 is a schematic of an exemplary e-beam tool showing a detail of the center tube that may be biased in accordance with a preferred embodiment of the present invention.

Furthermore, because the intrinsic physical positional errors such as resist thickness and the presence of contaminants will be the same in both the forward and the reverse scans, these errors will necessarily cancel out when the data from the reverse scan are reordered and subtracted from the data from the forward scan, leaving resist charging on the REFP as the source of the positional error. This is referred to as forward/backward error, when the first and second scans are run in the forward and backward directions. The magnitude of forward/backward error is dependent on the bias voltage applied to the center tube of the final lens of the e-beam optical column. As shown in FIG. 6, the absolute value of the error passes through a zero point. By determining the relationship between the center tube bias and the forward/backward error, the bias to the center tube of the final lens of the e-beam optical column may be adjusted to reduce and, in many cases, eliminate the error. Biasing the center tube creates an electric field between the tube and the target, which is nominally at ground potential. The field may then be used to attract or repel secondary or low voltage electrons that are expelled from the target, thereby eliminating the resist charging.

EXAMPLES

The preferred embodiment of the present invention was used to evaluate the magnitude of forward/backward error under various conditions and the following examples are provided by way of illustration and not by way of limitation.

A REFP was prepared to include gold-plated registration marks on a silicon substrate without a layer of resist. The REFP was subjected to a first and a second scan, the first scan stepping from a first field to a second field, through all the fields, in a forward-ordered serpentine path and the second scan stepping through the fields in a reverse-ordered serpentine path, i.e., from the second field to the first field with an e-beam tool to provide a baseline, or reference measurement of the registration mark positions. The scan in each field is performed by first causing the e-beam to go to the corners of the field where the marks are located and then scanning the beam over the marks with an electrostatic deflection system. The scan is of short duration and does not deposit any significant quantity of charge onto the substrate. The electrostatic scan determines the perceived locations of the marks relative to the design location.

Figure 4:
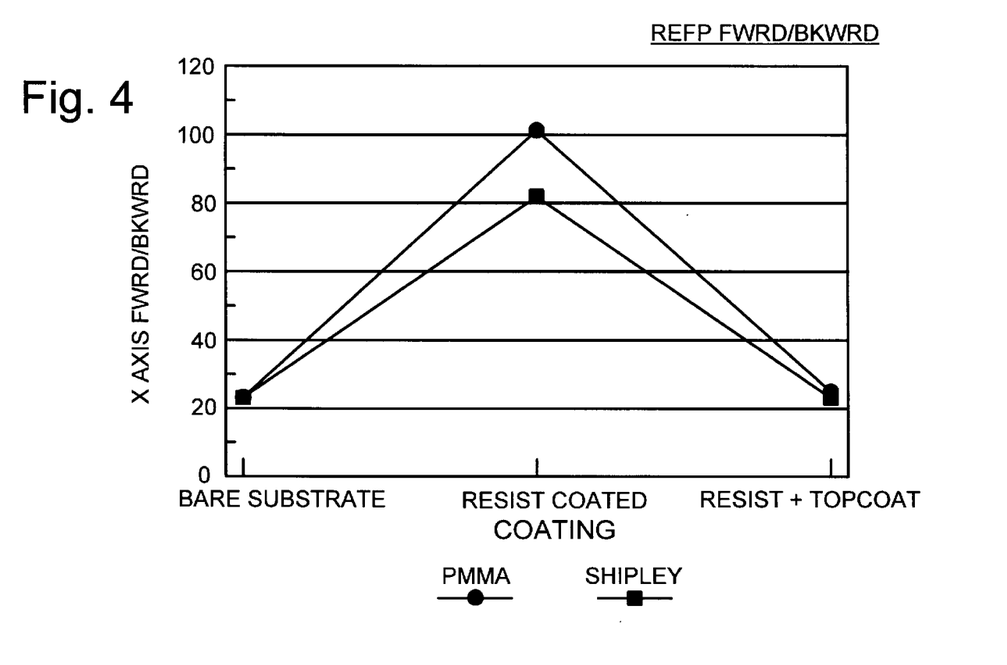
FIG. 4 is a graphic representation of the X-axis forward/backward error of the e-beam as an effect of resist charging.
Figure 5:
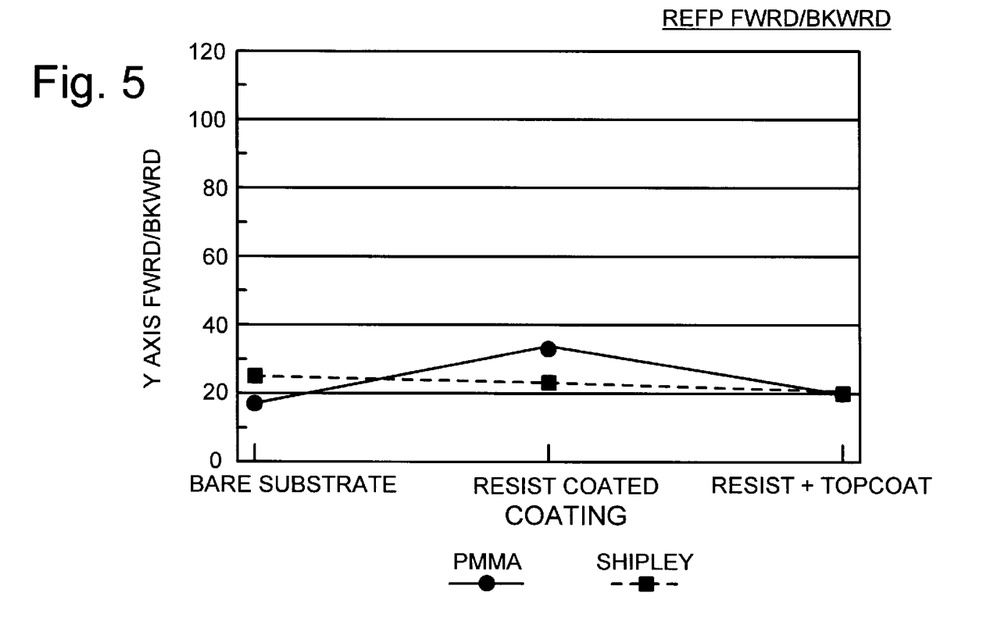
FIG. 5 is a graphic representation of the Y-axis forward/backward error of the e-beam as an effect of resist charging.

Secondly, a layer of resist was applied to the REFP, over the registration marks. The REFP was forward and reverse scanned and a substantial forward/backward error, attributable to resist charging, was observed. Two different resists were utilized for this testing: poly(methyl methacrylate) (PMMA), available from MicroLithography, Newton, Mass., a well-known lithographic resist; and XP3451B, a high-speed negative resist manufactured by the Shipley Corp., Marlboro, Mass. As can be seen in FIGS. 4 and 5, the forward/backward error was greater when PMMA was used as the resist as compared to the XP3451B.

In the final test case, a removable, conductive discharge topcoat layer of a polyaniline-vinyl polysulfuric acid composition as disclosed in U.S. Pat. No. 5,370,825, issued to Angelopolos et al., assigned to International Business Machines Corp. and incorporated herein by reference, known as a PANAQUA, was deposited over each of the resists and the REFPs were again forward and reverse scanned. The substantial forward/backward error, attributed to the effect of resist charging in the previous test cases, was eliminated.

FIGS. 4 (X-axis forward/backward error) and 5 (Y-axis forward/backward error) graphically illustrate the magnitude of REFP charging in the four test cases.

The results of the four test cases illustrate the effect of resist charging and also illustrate a method for decreasing the magnitude of its effect. As shown by the reduction in the magnitude of forward/backward error, depositing the topcoat layer onto the resist eliminated the effect of resist charging.

Examples of removable discharge conductive topcoats include, but are not limited to, polyanilines and aluminum. Polyanilines are water-soluble polymers obtained from the chemical oxidation of an aniline monomer onto a polyacid template. Other examples are provided in the Angelopoulos patent, referred to above. Using a polyaniline as a conductive topcoat offers certain advantages, such as, it can be processed with a high degree of transparency and it is water soluble and can easily be removed from the workpiece following the e-beam processing. Being soluble in potassium hydroxide (KOH), an aluminum topcoat would be appropriate when KOH developers are used in the lithographic process, as the development process would also remove the aluminum topcoat.

However, it is not always possible to find a conductive resist or topcoat with characteristics that meet the needs of a given lithographic process. In those cases, the center tube bias is optimized to minimize the effects of resist charging upon image placement. FIG. 6 shows data obtained for a sample resist coated REFP target at three different center tube bias voltages. It is clear that the data form a trend that crosses the zero error forward-backward line. By determining the relationship between the voltage and the forward/backward error, the e-beam tool may be operated with the center tube bias set at this voltage. Thus, the system becomes desensitized to the effects of resist charging.

It is another feature of the present invention that the REFP may be used as a process line monitor and a helpful tool for the process engineers on the line. When choosing which resist material to use the process engineer must look at a number of different criteria. The first level of criteria is whether a positive or a negative tone resist is required, then the range of exposure latitude for the tool must be explored. The engineer may then be left with only two or three possible resist formulations that would be appropriate given the processing conditions that must be used. From this group, the resist that is going to minimize the placement errors is chosen. This may now be done in accordance with the present invention by being able to determine the resist charging. The process engineer can now optimize the formulation and/or thickness of the resist, without having to proceed all the way through the manufacturing process to look at the placement of the images after formation. For example, the charging may be minimized by reducing the thickness of certain resist formulations, therefore, the process engineers could call for a reduced thickness of that resist in the apply process in order to maintain acceptable processing results. Certain formulations may induce more resist charging than others, as shown in the differences between the PMMA and the XP3451B. This being known, a given resist may be chosen for its reduced charging properties. Additionally, a particular formulation may cause more or less charging of the resist and, therefore, there may be applications in which certain formulations may not be acceptable.

The resist engineers may utilize the ability to quantify resist charging in order to evaluate different formulations of resist material. For example, the conductive topcoat materials disclosed in U.S. Pat. No. 5,370,825, referred to above, could each be tested to determine which of the genus of PANAQUAS is the most resistant to charging and, therefore, provides the best image placement quality. In a similar manner, the process of the present invention is useful to those creating conductive resist formulations. These formulations could be tested in series, each of which varies one component by a known amount.

The present invention could also be utilized for testing the health of the line with respect to the topcoat apply process. The thickness of the topcoat can be difficult to monitor because it is a very thin, transparent layer. Defects, for example the spin apply causing an area of zero topcoat in the center of the wafer, may be may be formed. These defects may be found by the process of the present invention by measuring the resist charging across the entire surface, thus showing areas where the resist charging was minimized, i.e., a thick enough coat was applied, and areas where the resist charging is the same as for the bare resist, thus indicating an area devoid of topcoat material. By changing the speed of the spin apply or the amount of topcoat to be applied, this defect may be corrected without having to complete the entire processing of the wafer.

Additionally, once data has been compiled for a number of different resists, the resist material can be tested from batch to batch or from supplier to supplier to ensure product quality without having to completely process the wafer.

It should be noted that while the first and second scans were performed in forward and backward paths over the entire surface of the REFP in this Example, partial scans could also have been performed in sample areas and the scans could have been in some other path, as long as the consistency and sensitivity are maintained. For example, the paths could be sent in the same path as would be followed in the actual exposure of a product, while at the same time exposing the product pattern. If this were to be done, the effects on resist charging on a particular pattern could be evaluated. Different writing orders could also be tested in order to determine if a reduction in charging effects could be realized by changing the writing sequence.

Additionally, the present invention may be implemented as an indicator of the stability of the standard manufacturing process. For example, a bare REFP could be coated with resist in the line on a weekly basis (or whatever other time period is deemed optimal) and the forward/backward effect may be measured. Any change from the previous period in the forward/backward effect may signify a change in the resist application process or formulation, which could then be corrected. The health of the line could also be monitored for the topcoat materials. In these manners, the line may be more carefully monitored and the variations discovered before any significantly detrimental problems occur.

This invention has been described in terms of specific embodiments, set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate.

Accordingly, what is claimed is:

1. A method for monitoring resist charging in a charged particle system comprising the steps of:

providing a substrate having uncoated registration marks in a known pattern thereon;

depositing a first charge at a series of predetermined positions on the substrate;

measuring the perceived position of the uncoated registration marks;

depositing a layer of a resist material over a surface of the substrate, thereby coating the registration marks;

depositing a second charge at the series of predetermined positions on the resist-coated substrate;

measuring the perceived position of the coated registration marks; and determining the difference in the perceived positions between the uncoated registration marks and the coated registration marks, the difference yielding an indication of charging in the layer of resist material.

2. The method of claim 1, wherein the measurements of the perceived positions of the registration marks are performed by a first scan and a second scan of the substrate.

3. The method of claim 2, wherein the first scan is performed with the X-Y stage moving from a first field to a second field in a forward-ordered serpentine path and the second scan is performed in a reverse-ordered serpentine path.

4. The method of claim 1, wherein the charged particle is selected from the group consisting of: an electron beam; an ion beam; a proton beam; an alpha-particle beam; and a positron beam.

5. The method of claim 4, wherein the charged particle is an electron beam, and wherein the electron beam is provided by an electron beam lithography tool and wherein the electron beam lithography tool includes a final lens having a center tube and wherein the method further comprises the step of including a bias on the center tube of the final lens of the electron beam lithography tool prior to the step of measuring the perceived position of the registration marks of the resist-coated substrate.

6. The method of claim 5, wherein the method further comprises adjusting the bias on the center tube of the final lens of the electron beam lithography tube to reduce the effects of resist charging.

7. The method of claim 1, wherein the registration marks are made from a material that is conductive, unreactive with oxygen and gives good contrast when exposed to a charged particle.

8. The method of claim 7, wherein the material is selected from the group consisting of: gold; tungsten; tantalum; and chrome.

9. The method of claim 1, wherein the registration marks are made from varying the surface topology of the substrate.

10. A method for monitoring resist charging in a charged particle system comprising the steps of:

providing a substrate having bare registration marks in a number of fields;

providing an charged particle beam lithography tool including an X-Y stage and a final lens having a center tube;

performing a first charged particle beam scan of a first field of a number of fields to determine a perceived position of the bare registration marks;

depositing an electron charge at predetermined positions within the number of fields on the substrate;

moving the X-Y stage of the charged particle beam lithography tool from the first field to a second field;

repeating the charged particle beam scanning step, the deposition of charge step, and the movement step until the number of fields of the bare registration marks have each been scanned;

performing a second charged particle beam scan of the bare registration marks by repeating the charged particle beam scanning step and the deposition of charge step, and the movement step until the number of fields have each been scanned, the movement step being carried out by moving the X-Y stage of the charged particle beam lithography tool in a direction different from the first movement to determine the position of the bare registration marks;

determining the difference in the position of the bare registration marks as determined by the first and the second charged particle beam scans;

depositing a layer of a resist onto the substrate, thereby forming resist-coated registration marks;

repeating the first and second scans of the number of fields and determining the difference in the position of the resist-coated registration marks as determined by the first and second charged particle beam scans; and determining the difference in the position of the bare registration marks and the resist-coated registration marks, the difference yielding an indication of charging in layer of resist material.

11. The method of claim 10, wherein the first charged particle beam scan of the resist layer is performed in a forward-ordered serpentine path and the second charged particle beam scan of the resist layer is performed in a reverse-ordered serpentine path.

12. The method of claim 10, wherein the charged particle beam is selected from the group consisting of: an electron beam; an ion beam; a proton beam; an alpha-particle beam; and a positron beam.

13. The method of claim 12, wherein the charged particle beam is an electron beam, and wherein the electron beam lithography tool includes a final lens having a center tube and wherein the method further comprises the steps of: including a bias on the center tube of the final lens of the electron beam lithography tool prior to the step of performing the first electron beam scan of the resist layer; and adjusting the bias to reduce the effects of resist charging.

14. The method of claim 13, wherein the amount of resist charging is measured by the method of claim 1.

15. The method of claim 14, wherein the amount of resist charging is measured by the method of claim 3.

16. The method of claim 15, wherein the charged particle is an electron beam, and wherein the electron beam is provided by an electron beam lithography tool and wherein the electron beam lithography tool includes a final lens having a center tube and wherein the method further comprises the step of including a bias on the center tube of the final lens of the electron beam lithography tool prior to the step of measuring the perceived position of the registration marks of the resist-coated substrate.

17. A method for selecting a resist film in a process for manufacturing an integrated circuit chip comprising the steps of:

determining the resist compositions suitable for use in a given tool and for a design of the integrated circuit chip;

measuring an amount of resist charging in a given area for each of the suitable resist compositions;

corresponding the amount of resist charging to an image placement error; and selecting the resist composition with the smallest image placement error.

18. The method of claim 17, wherein the amount of resist charging is measured by the method of claim 2.

19. The method of claim 17, wherein the charged particle is selected from the group consisting of: an electron beam; an ion beam; a proton beam; and a positron beam.

20. The method of claim 19, wherein the method further comprises adjusting the bias on the center tube of the final lens of the electron beam lithography tube to reduce the effects of resist charging.

21. The method of claim 20, wherein the material is selected from the group consisting of: gold; tungsten; tantalum; and chrome.

22. The method of claim 17, wherein the registration marks are made from a material that is conductive, unreactive with oxygen, and gives good contrast when exposed to a charged particle.

23. The method of claim 17, wherein the registration marks are made from varying the surface topology of the substrate.

24. The method of claim 23, further comprising the steps of:

coating the resist coated substrate with a layer of conductive topcoat;

performing a first charged particle scan of the conductive topcoat;

depositing an amount of charge at known locations;

performing a second charged particle scan of the conductive topcoat;

determining the difference between the first and second scans of the conductive topcoat; and     comparing the difference between the first and second perceived positions of the registration marks and the difference between the first and second scans of the conductive topcoat in order to determine if the conductive topcoat is reducing the charging.

25. A method for monitoring a resist application process in a manufacturing environment comprising the steps of:

providing a substrate having bare registration marks thereon, the bare registration marks having known perceived positions;

providing a charged particle lithography tool including a final lens having a center tube and an X-Y stage;

coating the substrate with a layer of resist;

performing a first charged particle scan of the layer of resist by moving the X-Y stage of the charged particle lithography tool to determine a first perceived position of the registration marks;

depositing a charge at predetermined positions on the layer of resist;

performing a second charged particle scan of the layer of resist by moving the X-Y stage of the charged particle lithography tool to determine a second perceived position of the registration marks;

determining the difference between the first and second perceived positions of the registration marks;

recording the value of the difference;

repeating the above steps periodically; and determining if there is a variation between periods.

26. The method of claim 25, further comprising the step of:

performing the first and second scans of the conductive topcoat on a periodical basis to determine if the topcoat apply process is consistent.

\* \* \* \* \*